US009278425B2

(12) United States Patent
Hashimoto et al.

(10) Patent No.: US 9,278,425 B2
(45) Date of Patent: Mar. 8, 2016

(54) POLISHING HEAD AND POLISHING APPARATUS

(75) Inventors: Hiromasa Hashimoto, Nishishirakawa (JP); Kouji Morita, Nishishirakawa (JP); Takashi Aratani, Nishishirakawa (JP); Hiromi Kishida, Nagano (JP); Satoru Arakawa, Nagano (JP)

(73) Assignees: SHIN-ETSU HANDOTAI CO., LTD., Tokyo (JP); FUJIKOSHI MACHINERY CORP., Nagano (JP)

( * ) Notice: Subject to any disclaimer, the term of this patent is extended or adjusted under 35 U.S.C. 154(b) by 854 days.

(21) Appl. No.: 13/522,370

(22) PCT Filed: Jan. 20, 2011

(86) PCT No.: PCT/JP2011/000281
§ 371 (c)(1), (2), (4) Date: Jul. 16, 2012

(87) PCT Pub. No.: WO2011/102078
PCT Pub. Date: Aug. 25, 2011

(65) Prior Publication Data

US 2012/0289129 A1 Nov. 15, 2012

(30) Foreign Application Priority Data

Feb. 19, 2010 (JP) ................................ 2010-035255

(51) Int. Cl.
*B24B 37/30* (2012.01)
*B24B 37/32* (2012.01)
*H01L 21/02* (2006.01)

(52) U.S. Cl.
CPC ................. *B24B 37/30* (2013.01); *B24B 37/32* (2013.01); *H01L 21/02024* (2013.01)

(58) Field of Classification Search
CPC ........ B24B 37/30; B24B 37/32; B24B 41/061
USPC ................................. 451/288, 290, 398, 402
See application file for complete search history.

(56) References Cited

U.S. PATENT DOCUMENTS 5,980,361 A 11/1999 Muller et al.
6,821,192 B1 11/2004 Donohue
(Continued)

FOREIGN PATENT DOCUMENTS

CN 1185028 A 6/1998
CN 1698185 A 11/2005
(Continued)

OTHER PUBLICATIONS

Taiwanese Search Report issued in Taiwanese Application No. 100103906 issued May 14, 2014 (with translation).
(Continued)

*Primary Examiner* — Lee D Wilson
*Assistant Examiner* — Jamal Daniel
(74) *Attorney, Agent, or Firm* — Oliff PLC

(57) ABSTRACT

A polishing head including, below a polishing head body, a rubber film held by a disk-shaped mid plate and an annular guide ring disposed around the rubber film holding the back surface of the workpiece on a lower face portion of the rubber film. The polishing head also includes a base member that is coupled to a polishing head body through an elastic film and holds the guide ring and the mid plate such that the lower surface of the guide ring does not contact the polishing pad during polishing. The polishing head and polishing apparatus, are operable in both of the rough polishing process and final polishing process, that can stably achieve predetermined high flatness and high polishing stock removal uniformity in polishing of a workpiece and can obtain a workpiece with fewer fine particles having a diameter of 45 nm or more.

18 Claims, 6 Drawing Sheets

(56) References Cited

U.S. PATENT DOCUMENTS

| | | | | |
|---|---|---|---|---|
| 6,848,980 | B2 * | 2/2005 | Chen et al. .................... | 451/285 |
| 2005/0124269 | A1 | 6/2005 | Masunaga et al. | |
| 2006/0148382 | A1 | 7/2006 | Hayama et al. | |
| 2007/0218817 | A1 | 9/2007 | Lee | |
| 2010/0056028 | A1 * | 3/2010 | Togawa et al. ................ | 451/398 |

FOREIGN PATENT DOCUMENTS

| | | | |
|---|---|---|---|
| CN | 2780407 | Y | 5/2006 |
| CN | 100447958 | C | 12/2008 |
| EP | 1 252 974 | A2 | 10/2002 |
| JP | A-5-69310 | | 3/1993 |
| JP | A-8-229804 | | 9/1996 |
| JP | A-9-29618 | | 2/1997 |
| JP | A-2000-190203 | | 7/2000 |
| JP | A-2003-311593 | | 11/2003 |
| JP | A-2005-161504 | | 6/2005 |
| JP | A-2007-67179 | | 3/2007 |
| JP | A-2009-107094 | | 5/2009 |
| JP | A-2009-248231 | | 10/2009 |
| TW | 200539283 | A | 12/2005 |
| TW | 1286965 | B | 9/2007 |
| TW | 1290502 | B | 12/2007 |
| TW | 200922745 | A | 6/2009 |
| WO | WO 2006/041248 | A1 | 4/2006 |

OTHER PUBLICATIONS

International Search Report issued in International Patent Application No. PCT/JP2011/000281 dated Mar. 22, 2011.

Office Action issued in Chinese Patent Application No. 2011800068511 dated Jan. 28, 2014 (with translation).

* cited by examiner (A)

(B)

(A)

(B)

POLISHING HEAD AND POLISHING APPARATUS

TECHNICAL FIELD

The present invention relates to a polishing head for holding a workpiece when the front surface of the workpiece is polished and a polishing apparatus provided with the polishing head, and more particularly to a polishing head for holding the workpiece on a rubber film and a polishing apparatus provided with the polishing head.

BACKGROUND ART

As an apparatus for polishing a surface of a workpiece such as a silicon wafer, there are a single-side polishing apparatus, in which the workpiece is polished by each side, and a double-side polishing apparatus, in which the both surfaces of the workpiece are polished at the same time.

As shown in FIG. 9, for example, a common single-side polishing apparatus comprises a turn table 93 onto which a polishing pad 94 is attached, a polishing agent supply mechanism 96, a polishing head 92 and so on. This polishing apparatus 91 polishes a workpiece W by holding the workpiece W with the polishing head 92, supplying a polishing agent 95 onto the polishing pad 94 through the polishing agent supply mechanism 96, rotating both the turn table 93 and the polishing head 92, and bringing the front surface of the workpiece W into sliding contact with the polishing pad 94.

With high integration of electronic devices in recent years, optical lithography processes are performed on silicon wafer substrates with smaller features, and minimum line widths are less than or equal to 45 nm. The shrinking of feature sizes is being advanced. There is therefore an increasing need for highly flattened silicon wafers.

The flatness of a workpiece such as a silicon wafer is finally determined in a single-side polishing process. In this process, as a method for holding the workpiece to improve the flatness, there is a method of attaching the workpiece onto a flat disk-shaped plate having high rigidity through an adhesive such as a wax. Particularly when uniform polishing stock removal is needed for the entire surface of the workpiece, a so-called rubber-chuck method is used in which a rubber film is used as a workpiece-holding portion instead of the disk-shaped plate having high rigidity, a pressurized fluid such as air is poured into the back face of the rubber film, and the rubber film is inflated by a uniform pressure so as to press the workpiece toward the polishing pad (See Patent Document 1, for example).

An example of the structure of a conventional polishing head by the rubber-chuck method is schematically shown in FIG. 5. An essential structure of the polishing head 101 includes an annular rigid ring 103, a rubber film 102 adhered to the rigid ring 103, and a mid plate 104 joined to the rigid ring 103. A sealed space 106 is defined by the rigid ring 103, the rubber film 102, and the mid plate 104. An annular template 105 is provided concentrically with the rigid ring 103 in a peripheral portion on a lower face portion of the rubber film 102. The pressure of the space is adjusted, for example, by supplying a pressurized fluid with a pressure adjustment mechanism 107 in the center of the mid plate 104. A pressing means, not shown, for pressing the mid plate 104 in the direction of the polishing pad 132 is provided.

With the polishing head 101 configured as above, the workpiece W is held on the lower face portion of the rubber film 102 through a backing pad 108, an edge portion of the workpiece W is held with the template 105, and the workpiece W and the template 105 are both brought into sliding contact with the polishing pad 132 attached onto the upper face of the turn table 133 by pressing the mid plate 104, thereby performing a rough polishing process.

Fine particles having a diameter of at least 45 nm or more present on the surface of silicon wafers may cause deterioration of product yields of electronic devices. A final polishing process, which is a single-side polishing process in a final stage, is closely associated with particle quality. In order to reduce particles on the surface of a workpiece such as a silicon wafer in the final polishing process, a workpiece holding plate is coupled to a polishing head body through a diaphragm while avoiding any contact of a polishing pad for final polishing except with the workpiece and a load is applied to the workpiece holding plate by using a fluid and the like, thereby performing the final polishing process (See Patent Document 2, for example).

An example of the structure of a conventional polishing head in use for final polishing is schematically shown in FIG. 6(A). In an essential structure of the polishing head 121 as shown in FIG. 6(A), a holding plate 124 having a rigid body such as ceramics is coupled to a head body 123 through a diaphragm 129 made of rubber. A large number of through-holes 130 for vacuum chuck of the workpiece W are formed in the holding plate 124. A backing pad 128 is adhered to the side on which the workpiece W is attached by chuck, and a back plate 122 is provided at a back face side. A ring 125 is also provided so as to surround the holding plate. Adjusting pressure of a space between the holding plate 124 and the back plate 122 through a passage 127 for controlling workpiece chuck enables the vacuum chuck attachment and detachment of the workpiece W. Adjusting pressure of a space between the back plate 122 and the head body 123 through a passage 126 for pressing a workpiece enables adjustment of pressing force of the workpiece W against the polishing pad 132 attached onto the turn table 133.

FIG. 6(B) shows an enlarged view around the ring 125 shown in FIG. 6(A). As shown in FIG. 6(B), polishing can be performed such that the ring 125 does not press the polishing pad 132. When the thickness of a wafer W is 0.775 mm, for example, the ring 125 and the holding plate 124 are placed so that the surface (the surface to be polished) of the wafer W protrudes from the lower face of the ring 125 by 0.20 to 0.35 mm. This prevents the wafer W from being detached during polishing and enables polishing without pressing the polishing pad 132 by the ring 125, thereby preventing generation of particles from the ring 125.

There is however a problem in that surface irregularities of the holding plate 124 having a rigid body such as ceramics is transferred to the workpiece and the flatness thereby deteriorates.

To obtain highly flat workpieces with fewer particles, the polishing head by the so-called rubber-chuck method is commonly used in the rough polishing process, in which the rubber film is used as the workpiece-holding portion, a pressurized fluid such as air is poured into the back face of the rubber film, and the rubber film is inflated by a uniform pressure so as to press both the workpiece and the template holding the edge portion of the workpiece toward the polishing pad. In the final polishing process, the polishing head for final polishing is used in which a load is applied by using a fluid and the like to the workpiece holding plate coupled to the polishing head body through the diaphragm while avoiding any contact of the polishing pad for final polishing except with the workpiece.

As described above, two kinds of polishing heads are conventionally needed, and a larger polishing machine including both of the above polishing apparatus 141 having the polishing head 101 for rough polishing and polishing apparatus 151 having the polishing head 121 for final polishing is therefore needed, for example as shown in FIG. 7. As a result, there is a need to provide a larger space in a clean room, which has high utility cost, the cost of the polishing machine itself becomes higher, and thus there arises a high cost problem.

There is also disclosed a rubber-chuck polishing head that is seems to reduce particles by avoiding any contact of the polishing pad except with the workpiece during polishing and polish the workpiece with high flatness (See Patent Document 3).

CITATION LIST

Patent Literature

Patent Document 1: Japanese Unexamined Patent publication (Kokai) No. H05-69310
Patent Document 2: Japanese Unexamined Patent publication (Kokai) No. 2007-67179
Patent Document 3: Japanese Unexamined Patent publication (Kokai) No. 2009-107094

SUMMARY OF INVENTION

A schematic view of the polishing head disclosed in Patent Document 3 is shown in FIG. 8. In the polishing head 111, as shown in FIG. 8, the rubber film 112 presses the workpiece W, the guide ring 115 that is disposed around the rubber film 112 and fixed to the body 113 holds the side surface of the workpiece W, and the mid plates 114*a* and 114*b* fixing the rubber film 112 are coupled to the guide ring 115 through an elastic film 119.

When this polishing head is used for polishing, however, it has been impossible to reduce fine particles having a diameter of 45 nm or more.

In view of this, the present inventors investigated and conducted studies on the cause for inability to reduce the particles. As a result, the present inventors found that frictional force in a radial direction (i.e., a rotation direction about the rotating axis of the polishing head) applied from the polishing pad during final polishing cannot be absorbed with the elastic film 119, because the mid plate 114*a* is pressed to a stopper 118 by vacuum chuck during polishing, and the workpiece W therefore damages the final polishing pad during polishing. This causes excessive polishing and particles are created from the final polishing pad. The created fine particles are consequently attached to the workpiece.

The present inventors also found the following. In the conventional polishing head, a side wall portion of the rubber film 112 contacts an inner wall of the guide ring 115 fixed to the body 113 during polishing. This contact prevents the elastic film 119 from absorbing the frictional force in a radial direction applied from the polishing pad to the rubber film 112 and workpiece W, even when there is no vacuum chuck of the mid plate 114*a* with the stopper 118 as above. Therefore, fine particles are attached to the workpiece also in this case.

As described above, it has been impossible to obtain a workpiece with fewer fine particles having a diameter of particularly 45 nm or more while ensuring predetermined high flatness and high polishing stock removal uniformity by using one conventional polishing head alone.

The present invention was accomplished in view of the above-described problems, and its object is to provide a polishing head and polishing apparatus, operable in both of the rough polishing process and final polishing process, that can stably achieve predetermined high flatness and high polishing stock removal uniformity in polishing of a workpiece and can obtain a workpiece with fewer fine particles having a diameter of particularly 45 nm or more.

To achieve this object, the present invention provides a polishing head comprising: a disk-shaped mid plate provided below a polishing head body; a rubber film that covers at least a lower face portion and a side face portion of the mid plate, the rubber film being held by the mid plate; an annular guide ring for holding a side surface of a workpiece, the guide ring being disposed around the rubber film; a first sealed space portion surrounded by the mid plate and the rubber film; and a first pressure adjustment mechanism for adjusting pressure of the first sealed space portion by supplying fluid to the interior of the first sealed space portion, the polishing head being configured to hold a back surface of the workpiece on a lower face portion of the rubber film, press the workpiece with the first pressure adjustment mechanism, and bring a front surface of the workpiece into sliding contact with a polishing pad attached onto a turn table to polish the workpiece, the polishing head including a base member coupled to the polishing head body through an elastic film, the base member holding the guide ring and the mid plate such that a lower surface of the guide ring does not contact the polishing pad during polishing, wherein the base member is restricted from moving in an axial direction by contact between a part of an upper surface of the base member and the polishing head body and is capable of moving in a radial direction through the elastic film during polishing.

In the polishing head including the base member that is coupled to the polishing head body through the elastic film and holds the guide ring and the mid plate such that the lower surface of the guide ring does not contact the polishing pad during polishing, wherein the base member is restricted from moving in an axial direction by contact between a part of the upper surface of the base member and the polishing head body and is capable of moving in a radial direction through the elastic film during polishing, uniform pressing force can be stably applied across the workpiece, and predetermined high flatness and high polishing stock removal uniformity can be stably ensured. In addition to this, the generation of particles from the guide ring can be prevented. In the polishing head, the frictional force in a radial direction applied from the polishing pad can be absorbed through movement of the base member in a radial direction, and the polishing pad is prevented from being damaged by the workpiece so that the generation of particles from the polishing pad due to excessive fiction can be inhibited. As a result, the workpiece with fewer fine particles having a diameter of particularly 45 nm or more can be obtained. Moreover, the polishing head is operable in both of the rough polishing process and final polishing process, thereby reducing cost.

In the polishing head, a contact portion between the part of the upper surface of the base member and the polishing head body is preferably configured such that the part of the upper surface of the base member contacts the polishing head body through a perfect sphere disposed in a concave portion provided at the polishing head body and/or the base member.

When the contact portion between the part of the upper surface of the base member and the polishing head body is configured such that the part of the upper surface of the base member contacts the polishing head body through the perfect sphere disposed in the concave portion provided at the polishing head body and/or the base member, the base member can readily move in a radial direction while movement of the base member in an axial direction is restricted, and the generation of particles can be thereby inhibited more surely.

In the present invention, the contact between the part of the upper surface of the base member and the polishing head body is not limited to direct contact between them but includes indirect contact through the perfect sphere, that is, as long as the movement in an axial direction is restricted by interference of the polishing head body with the upper surface of the base member.

The polishing head preferably including a second sealed space portion surrounded by the base member, the polishing head body and the elastic film and a second pressure adjustment mechanism for adjusting pressure of the second sealed space portion.

In the polishing head including the second sealed space portion surrounded by the base member, the polishing head body and the elastic film and the second pressure adjustment mechanism for adjusting pressure of the second sealed space portion, reducing the pressure of the second sealed space portion enables the lower surface of the guide ring to be more surely prevented from contacting the polishing pad during polishing and the base member to be surely prevented from moving in an axial direction.

In the polishing head, a thrust bearing or a dry bearing can be used in the contact portion between the part of the upper surface of the base member and the polishing head body.

When a thrust bearing is used in the contact portion between the part of the upper surface of the base member and the polishing head body, the polishing head can be readily constituted by using a commercially available bearing, and the base member can readily move in a radial direction while its movement in an axial direction can be more surely prevented. When the dry bearing is used, maintenance such as lubricant supply is not needed.

In the polishing head, an outer circumferential portion of the rubber film held by the mid plate is preferably bifurcated such that the first sealed space portion is divided into two sealed spaces, and pressure of the divided two sealed spaces is adjustable independently of each other.

In the polishing head wherein the outer circumferential portion of the rubber film held by the mid plate is bifurcated such that the first sealed space portion is divided into two sealed spaces, and pressure of the divided two sealed spaces is adjustable independently of each other, for example, when the first sealed space portion is divided into two sealed spaces that cover mainly the lower face portion and the side face portion of the mid plate respectively and pressure of the two sealed spaces are adjusted separately from each other during polishing, uniform pressing force can be more surely applied across the workpiece, and the polishing can be performed while ensuring high flatness over the entire surface of the workpiece, particularly at its outer circumferential portion.

Furthermore, the present invention provides a polishing apparatus used for polishing a front surface of a workpiece including a polishing pad attached onto a turn table, a polishing agent supply mechanism for supplying a polishing agent onto the polishing pad, and the above-described polishing head of the present invention as a polishing head for holding the workpiece.

When the workpiece is polished by using the polishing apparatus including the polishing head of the present invention, the workpiece can be polished while uniform pressing force is stably applied across the workpiece, and the polishing can be performed while ensuring high flatness over the entire surface of the workpiece, particularly at its outer circumferential portion and inhibiting the generation of particles.

In the polishing head of the present invention, the base member that is coupled to the polishing head body through an elastic film and holds the guide ring and the mid plate such that a lower surface of the guide ring does not contact the polishing pad during polishing is provided, and the base member is restricted from moving in an axial direction by contact between a part of the upper surface of the base member and the polishing head body and is capable of moving in a radial direction through the elastic film during polishing. As a result, predetermined high flatness and high polishing stock removal uniformity can be stably achieved in polishing of a workpiece, and a workpiece with fewer fine particles having a diameter of particularly 45 nm or more can be obtained. The polishing head is also operable in both of the rough polishing process and final polishing process, thereby reducing cost.

DESCRIPTION OF EMBODIMENTS

Hereinafter, embodiments of the present invention will be described, but the present invention is not restricted to these embodiments.

In conventional processes of polishing the surface of workpieces such as silicon wafers, primary polishing is performed with a double-side polishing apparatus first, and secondary polishing is then performed with a single-side polishing apparatus. In the secondary polishing, the rough polishing process is performed while maintaining high flatness ensured in the primary polishing, and the final polishing process is performed to mainly reduce particles. Since two different polishing heads and a larger polishing machine are required for the rough and final polishing processes, there is a need to provide a larger space in a clean room, which has high utility cost, the cost of the polishing machine itself becomes higher, and there is thus a high cost problem.

The operation of the rough polishing process and final polishing process by using the identical polishing head have been attempted in the secondary polishing. However, a workpiece with fewer fine particles having a diameter of particularly 45 nm or more cannot be obtained by this operation, whereas a certain degree of flatness and polishing stock removal uniformity are ensured.

In view of this, the present inventors repeatedly and keenly conducted studies to solve the problem. The present inventor's investigation of the cause for particle generation as to the conventional polishing head revealed the following major cause: the workpiece damages the polishing pad due to the frictional force in a radial direction applied from the polishing pad during polishing; this causes excessive polishing and particles are created from the polishing pad; and the created particles are then attached to the workpiece, as described above. Here, the radial direction means a direction in which the polishing head rotates about its rotating axis (a rotation direction of the workpiece).

As a result of additional studies, the present inventors conceived that a polishing head in which the base member holds the guide ring and the mid plate holding the rubber film and the base member is coupled movably in a radial direction to the polishing head body through an elastic film enables the frictional force in a radial direction applied from the polishing pad to be absorbed. The present inventors also conceived that restricting the movement of the base member in an axial direction by contact between a part of the upper surface of the base member and the polishing head body enables uniform pressing force to be stably applied across the workpiece during polishing, thereby bringing the present invention to completion.

Figure 1:
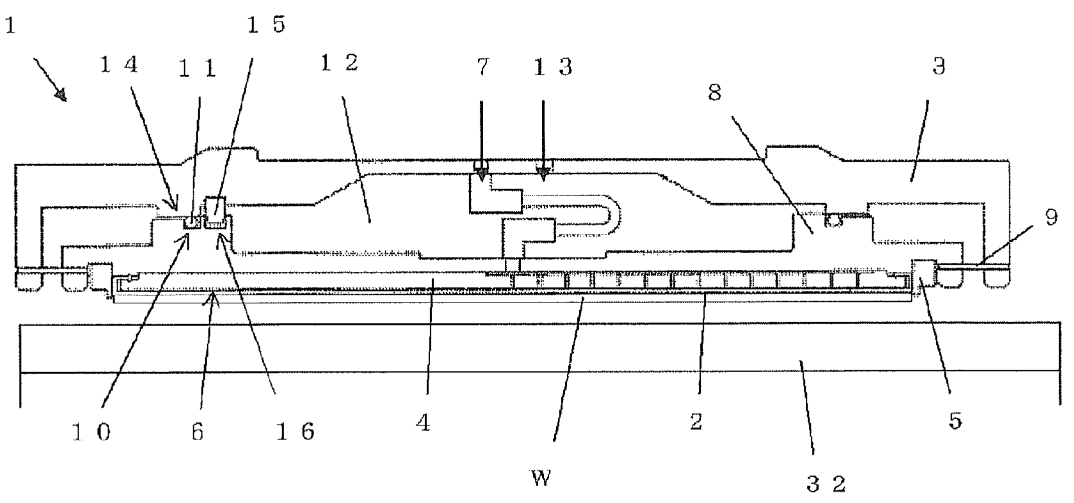
FIG. 1 is a schematic view showing an example of the polishing head of the present invention.

FIG. 1 is a schematic view showing an example of the polishing head of the present invention.

As shown in FIG. 1, the polishing head 1 of the present invention includes the rubber film 2, the mid plate 4 that holds the rubber film 2, the base member 8 that holds the rubber film 2 and the mid plate 4, and the guide ring 5, provided below the polishing head body 3.

The rubber film 2 covers at least the lower face portion and the side face portion of the mid plate 4 and the outer circumferential portion of the rubber film 2 is held by the mid plate 4. A method of holding the rubber film 2 is not limited in particular. For example, the end of the outer circumferential portion of the rubber film 2 may be formed into an O-ring shape and the O-ring part may be interposed and held between the mid plate 4 and the base member 8. Alternatively, the mid plate 4 may be configured so that two members are placed one above the other, and the O-ring part of the end of the rubber film 2 may be interposed and held between them.

The annular guide ring 5 is disposed around the rubber film 2. The back surface of the workpiece W is held on the lower face portion of the rubber film 2 while the guide ring 5 is holding the side surface of the workpiece W to prevent the workpiece W from being detached during polishing.

The first sealed space portion 6 surrounded by the rubber film 2 and the mid plate 4 is defined. As shown in FIG. 1, the mid plate 4 has a plurality of through-holes vertically formed therein, and a fluid is supplied from the first pressure adjustment mechanism 7 to the interior of the first sealed space portion 6 so that the pressure of the first sealed space portion can be adjusted. The polishing head has a structure that the rubber film 2 is inflated by the supply of the fluid and pressing force is applied to the back surface of the workpiece W held on the lower face portion of the rubber film 2. This structure enables uniform pressing force to be applied across the workpiece.

When the workpiece W is held, a backing pad is preferably adhered to the lower face portion of the rubber film 2 to protect the back surface of the workpiece W.

The base member 8 holds the guide ring 5 and the mid plate 4. In this case, the guide ring 5 is held such that the lower surface of the guide ring 5 does not contact the polishing pad 32 during polishing. When the guide ring 5 is held in this manner, generation of particles from the guide ring 5 due to pressing the polishing pad 32 by the guide ring 5 during polishing can be prevented. The position of the lower surface of the guide ring 5 is not limited in particular. When the thickness of the workpiece W is 0.775 mm, for example, the position may be set such that the workpiece W surface to be polished protrudes from the lower surface of the guide ring 5 by 0.2 to 0.35 mm.

The base member 8 is disposed such that the contact portion 14 in a part of its upper surface contacts the polishing head body 3, and the base member 8 is thereby restricted from moving in an axial direction (the direction of the rotating axis of the polishing head). This restriction enables uniform pressing force to be stably applied across the workpiece W during polishing, and the workpiece W can be therefore polished while stably ensuring predetermined high flatness and high polishing stock removal uniformity.

The base member 8 is coupled to the polishing head body 3 through the elastic film 9. In the polishing head configured such that the base member 8 holding the mid plate 4 and the guide ring 5 is coupled to the polishing head body 3 through the elastic film 9, the base member 8 can move in a radial direction through the elastic film 9, and the frictional force in a radial direction applied from the polishing pad 32 can be absorbed through the movement of the base member 8 in a radial direction. The polishing pad 32 is thereby prevented from being damaged by the workpiece so that the generation of particles from the polishing pad 32 due to excessive fiction can be inhibited. As a result, the workpiece W with fewer fine particles having a diameter of particularly 45 nm or more can be obtained.

As described above, since the polishing head of the present invention can polish the workpiece W while stably ensuring predetermined high flatness and high polishing stock removal uniformity and reducing the fine particles having a diameter of particularly 45 nm or more, the polishing head can be used in both of the rough polishing process and final polishing process, thereby reducing cost.

The second sealed space portion 12 surrounded by the base member 8, the polishing head body 3 and the elastic film 9 can be formed and the second pressure adjustment mechanism 13 for adjusting the pressure of the second sealed space portion 12 can be provided. By reducing the pressure of the second sealed space portion 12 with the second pressure adjustment mechanism 13, the lower surface of the guide ring 5 can be more surely prevented from contacting the polishing pad 32 during polishing, and the movement of the base member 8 in an axial direction can be surely prevented.

As shown in FIG. 1, the contact portion 14 between the part of the upper surface of the base member 8 and the polishing head body 3 can be configured such that the concave portion 10 is provided at the polishing head body 3 or the base member 8, the perfect sphere 11 is disposed in the concave portion 10, and the part of the upper surface of the base member contacts the polishing head body through the perfect sphere 11. Alternatively, the concave portion may be provided at both of the polishing head body 3 and the base member 8. These preferable configuration enables the base member 8 to more readily move in a radial direction.

The preferable number of the perfect sphere 11 provided is three or more considering wear of the perfect sphere 11 and the like, but the number is not limited in particular.

Figure 2:
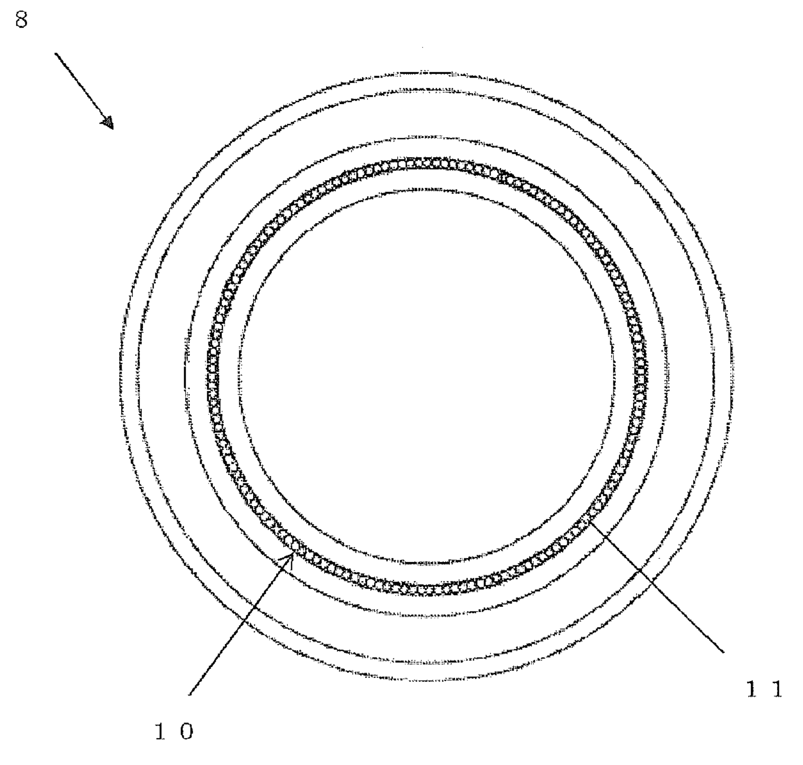
FIG. 2 is a schematic top view showing an example of the base member of the polishing head of the present invention.

FIG. 2 is a schematic view showing an example of a base member 8 having a concave portion 10 formed into a ring shape and perfect spheres 11 disposed in the concave portion 10. As shown in FIG. 2, a large number of perfect spheres 11 are disposed to fill the ring-shaped concave portion 10. This configuration inhibits the wear of the perfect spheres 11, extends its lifetime, and makes the movement of the base member 8 in a radial direction easier.

Alternatively, a thrust bearing or a dry bearing can be used in the contact portion 14 between the part of the upper surface of the base member 8 and the polishing head body 3.

When the thrust bearing is used in the contact portion 14 between the part of the upper surface of the base member 8 and the polishing head body 3, the polishing head can be more readily constituted by using a commercially available bearing, and the base member 8 can more readily move in a radial direction while the movement of the base member 8 in an axial direction can be more surely prevented. When the dry bearing is used, maintenance such as lubricant supply is not needed.

As shown in FIG. 1, when a ring-shaped groove 16 is formed at the contact portion 14 on the upper surface of the base member 8 and a guide 15 provided at the lower surface of the polishing head body 3 is disposed so as to be engaged with the groove 16, the movement of the base member 8 in any direction except the radial direction can be inhibited and the pressing force to the workpiece W can be thereby maintained more stably. Alternatively, the groove 16 may be provided at the lower surface of the polishing head 3 and the guide 15 to be engaged with the groove may be provided at the upper surface of the base member 8. The guide 15 and the groove 16 can be provided together with the above concave portion 10 and perfect sphere 11. Alternatively, either one of them, for example, the guide 15 and the groove 16 only may be provided.

FIG. 3(A) shows another example of the polishing head of the present invention. FIG. 3(B) is an enlarged view of the vicinity of the outer circumferential portion of the rubber film 2 in FIG. 3(A). As shown in FIGS. 3(A) and (B), the outer circumferential portion of the rubber film 2 held by the mid plate 4 is bifurcated in the polishing head 21. The first sealed space portion 6 is divided into a sealed space portion 6*a* that mainly contacts the side surface of the mid plate 4 and a sealed space portion 6*b* that mainly contacts the lower surface of the mid plate 4.

The pressure of the divided two sealed spaces 6*a* and 6*b* is adjustable independently of each other with the first pressure adjustment mechanisms 7*a* and 7*b*.

In the rough polishing process, for example, the pressing force of the sealed space portion 6*a* contacting the side surface of the mid plate 4 and the pressing force of the sealed space portion 6*b* contacting the lower surface of the mid plate 4 are adjusted to make the shape of the workpiece W before polishing flatter after polishing so that the flatness of the polished workpiece W at its outer circumferential portion can be more improved. In the final polishing process, the pressing force of the sealed space portion 6*a* and the pressing force of the sealed space portion 6*b* are set to be equal so that the workpiece W can be polished with uniform final polishing stock removal in its plane. This enables uniform surface roughness in its plane.

Figure 4:
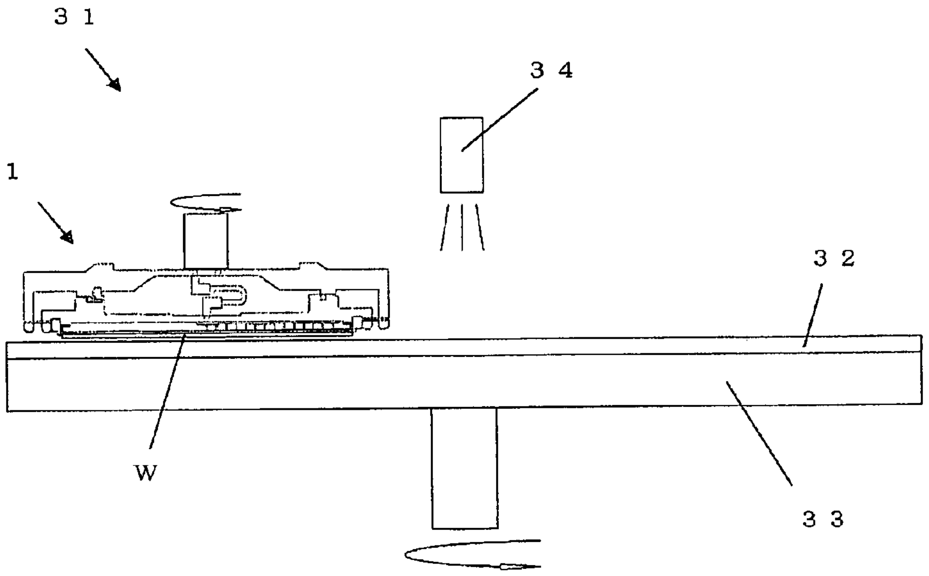
FIG. 4 is a schematic view showing an example of the polishing apparatus of the present invention.
Figure 5:
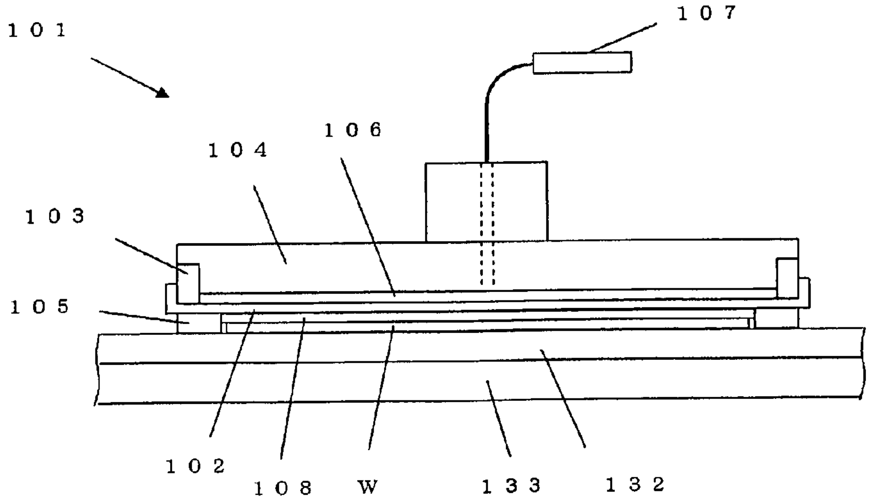
FIG. 5 is a schematic view showing an example of a conventional polishing head.
Figure 6:
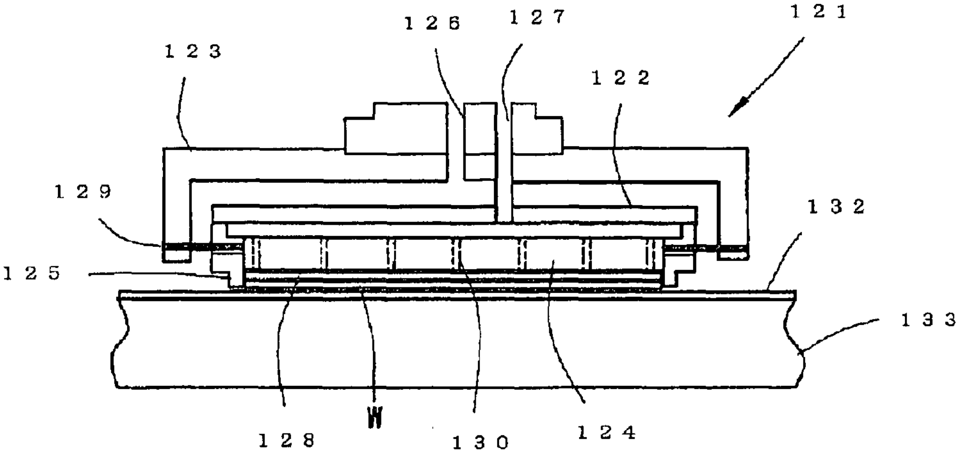
FIG. 6 are schematic views showing another example of a conventional polishing head, in which (A) shows a schematic view of a conventional polishing head, and (B) shows an enlarged view of a part of (A).
Figure 6:
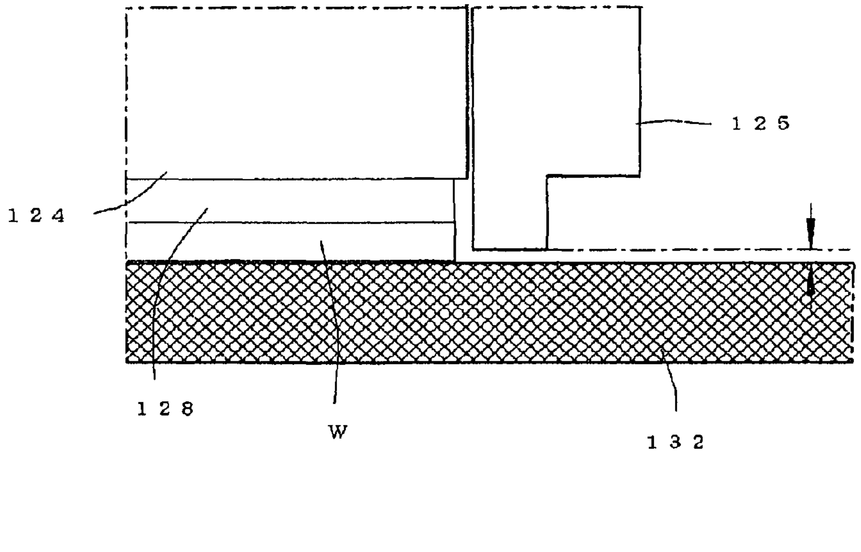
Figure 7:
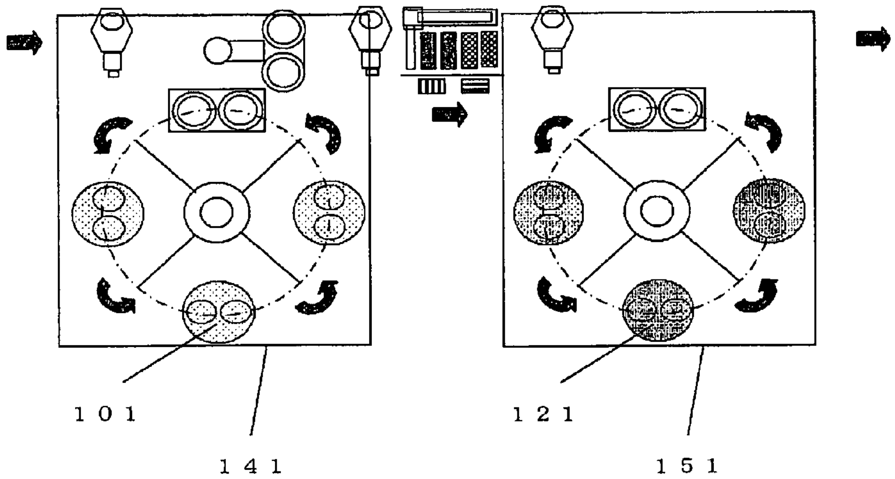
FIG. 7 is a schematic view showing an example of a conventional single-side polishing apparatus.

FIG. 4 shows a schematic view of an example of the polishing apparatus of the present invention including the polishing head of the present invention.

As shown in FIG. 4, the polishing apparatus 31 includes the turn table 33, the polishing pad 32 attached onto the turn table 33, the polishing agent supply mechanism 34 for supplying a polishing agent onto the polishing pad 32, and such as the polishing head 1 of the present invention shown in FIG. 1.

When the workpiece is polished by using the polishing apparatus including the polishing head of the present invention, the workpiece can be polished while uniform pressing force is stably applied across the workpiece, and the polishing can be performed while ensuring high flatness over the entire surface of the workpiece, particularly at its outer circumferential portion and the generation of fine particles having a diameter of particularly 45 nm or more is inhibited.

EXAMPLE

The present invention will be more specifically described below with reference to Examples and Comparative Example, but the present invention is not limited to these examples.

Example 1

First, a p-type, 300 mm diameter silicon single crystal ingot having an orientation of <100> and a resistivity of 8 to 12 Ωcm pulled by the Czochralski method was sliced into thin disk-shaped wafers. Chamfering processes were performed on the outer edges of the wafers to prevent the wafers from being broken and chipped, and lapping processes were then performed to flatten the wafers. Next, etching processes were performed to remove strain by machining remaining on the surfaces of the lapped wafers. Both of the front and back surfaces of the wafers were double-side polished. The chamfered portions were also polished. The thicknesses of the wafers were each adjusted to be 0.775 mm.

A silicon wafer was polished with the polishing apparatus of the present invention shown in FIG. 4, including the polishing head of the present invention shown in FIG. 1. The used polishing head was configured as follows: a boot-shaped rubber film made of silicone 70° having a thickness of 1 mm, a lower face portion diameter of 301 mm, a height of 6.5 mm, and an end portion that was formed into an O-ring shape (a diameter of 2 mm) and defined a diameter of 289 mm was interposed and held between the base member and the mid plate. A circular backing pad was adhered to the lower face portion of the rubber film with a double-stick tape.

Moreover, a guide ring having an inner diameter of 302 mm was disposed around the rubber film and attached to the base member. The inside of a ring-shaped elastic film was attached to a fixed ring-shaped portion of the base member, and the perfect sphere was inserted into the ring shaped concave portion provided at the upper surface of the base member. The outside of the elastic film was attached to a fixed ring-shaped portion of the polishing head body.

When a vacuum was produced in the second sealed space portion surrounded by the polishing head body, the elastic film, and the base member and the base member was brought into contact with the polishing head body through the perfect sphere, the distance between the lower surface of the guide ring and the surface of the polishing pad fell within 0.25 mm to 0.30 mm. The thickness of the guide ring was adjusted in advance to adjust the height of the rubber film so as to ensure uniform polishing stock removal.

The rough and final polishing processes were performed in the following way.

The rough polishing conditions will be described below.

<Rough Polishing>

A polishing pad of a polyester nonwoven fabric including urethane resin (an ASKER C hardness of 60°) was used. A 10.5-pH alkali solution containing colloidal silica was used as a polishing slurry. The polishing head and the turn table were each rotated at 30 rpm. The polishing pressure to the wafer was set to 15 kPa for the rough polishing. The polishing time was three minutes and two stage polishing was performed.

The final polishing conditions will be described below.

<Final Polishing>

A suede type polishing pad (an ASKER C hardness of) 57° was used. A 10-pH alkali solution containing colloidal silica was used as a final polishing slurry. The polishing head and the turn table were each rotated at 20 rpm. The polishing pressure to the wafer was set to 10 kPa. The final polishing was performed for three minutes.

Chemical cleaning processes were performed as cleaning after the final polishing. In the chemical cleaning processes, two tanks containing a cleaning mixed solution of ammonia water (28%), hydrogen peroxide water (30%), and pure water with a volume mix proportion of 1:1:10 and one tank containing a cleaning mixed solution of hydrochloric acid (10%), hydrogen peroxide water (30%), and pure water with a volume mix proportion of 1:1:100 were used as chemical solution tanks for cleaning under conditions of a temperature of 75° C. and a takt time of three minutes. Wash in water and drying were then carried out.

After the cleaning processes, a particle counter (SurfscanSP-2 made by KLA-Tencor Co., Ltd.) was used to measure particles, and the number of the fine particles having a diameter of 45 nm or more was measured by measurement under high resolving power conditions.

The polishing stock removal uniformity of the wafer was then evaluated. The polishing stock removal uniformity was obtained by measuring the thicknesses of the workpiece before and after polishing at equal to or more than 1000 measurement points in a region excluding an outermost circumferential portion 2 mm width, with a commercial flatness measurement instrument for exclusive use of silicon wafers, calculating polishing stock removal at the measurement points in the region of the wafer, and using the following formula.

Polishing Stock Removal Uniformity (%)=(maximum polishing stock removal−minimum polishing stock removal)/(average polishing stock removal in all the measurement points)

Referring to Table 1 showing the results, the number of particles having a diameter of 45 nm or more in the polished wafer was five. The polishing stock removal uniformity was 7.1%.

It was thus seen that the number of particles was greatly reduced while ensuring high polishing stock removal uniformity in Example 1 as comparison with the results of Comparative Example.

As described above, it was confirmed that the polishing head of the present invention and the polishing apparatus including the polishing head are operable in both of the rough polishing process and final polishing process, can achieve predetermined high flatness and high polishing stock removal uniformity, and can obtain a workpiece with fewer fine particles having a diameter of 45 nm or more.

Example 2

Figure 3:
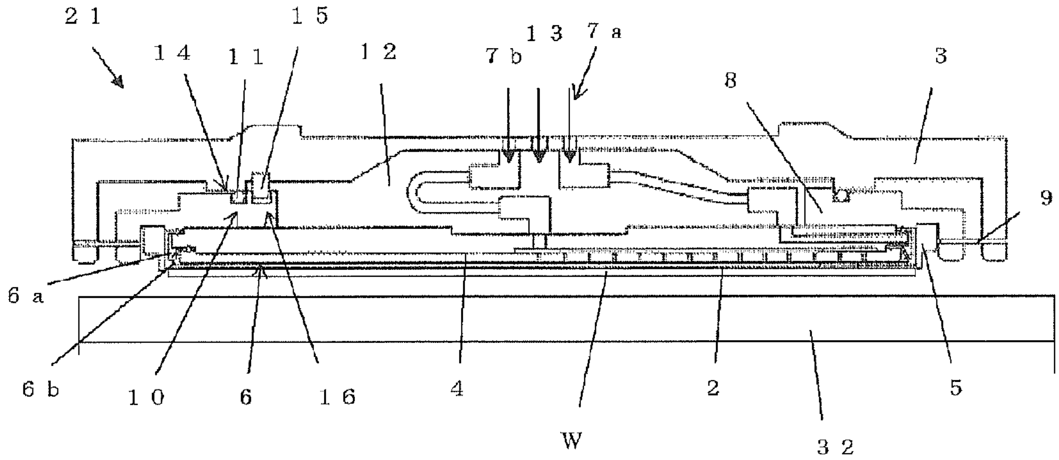
FIG. 3 are schematic views showing another example of the polishing head of the present invention.
Figure 3:
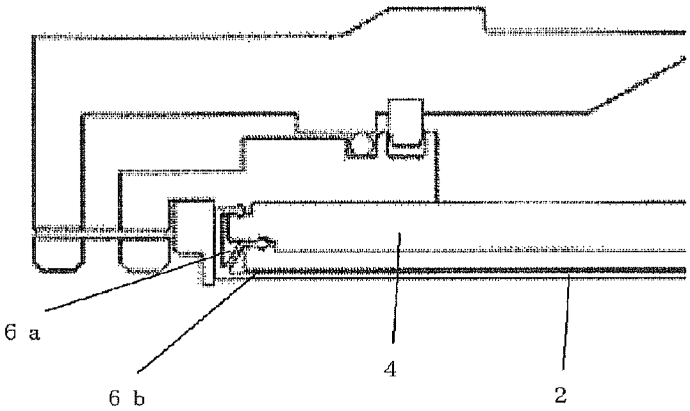

The rough polishing and final polishing were consecutively performed on silicon wafers as with Example 1 with the polishing head of the present invention including the first sealed space portion divided into two sealed spaces, shown in FIG. 3 and the polishing apparatus of the present invention, shown in FIG. 4. After cleaning, the same evaluation as Example 1 was carried out.

Polishing conditions and so on will be described below.

<Rough Polishing>

A polishing pad of a polyester nonwoven fabric including urethane resin (an ASKER C hardness of 60°) was used. A 10.5 pH alkali solution containing colloidal silica was used as a polishing slurry. The polishing head and the turn table were each rotated at 30 rpm. The polishing pressure to the front surface of the wafer was set to 15 kPa and the polishing pressure to its side wall face was 17 kPa for the rough polishing. The polishing time was three minutes and two stage polishing was performed.

<Final Polishing>

A suede type polishing pad (an ASKER C hardness of) 57° was used. A 10 pH alkali solution containing colloidal silica was used as a final polishing slurry. The polishing head and the turn table were each rotated at 20 rpm. The polishing pressure to the front surface of the wafer was set to 10 kPa and the polishing pressure to its side wall face was 10 kPa. The final polishing was performed for 3 minutes.

Referring to Table 1 showing the results, the number of particles having a diameter of 45 nm or more in the polished wafer was two. The polishing stock removal uniformity was 6.3%.

The polishing stock removal uniformity in Example 2 was thus improved in Example 2 in comparison with Example 1.

It is understood that the pressing force across the workpiece W can be more effectively made to be uniform by pressuring the interior of the sealed space portion contacting the side surface of the mid plate to adjust the pressing force to the outer circumferential portion of the workpiece W in the rough polishing processes.

Comparative Example

Figure 8:
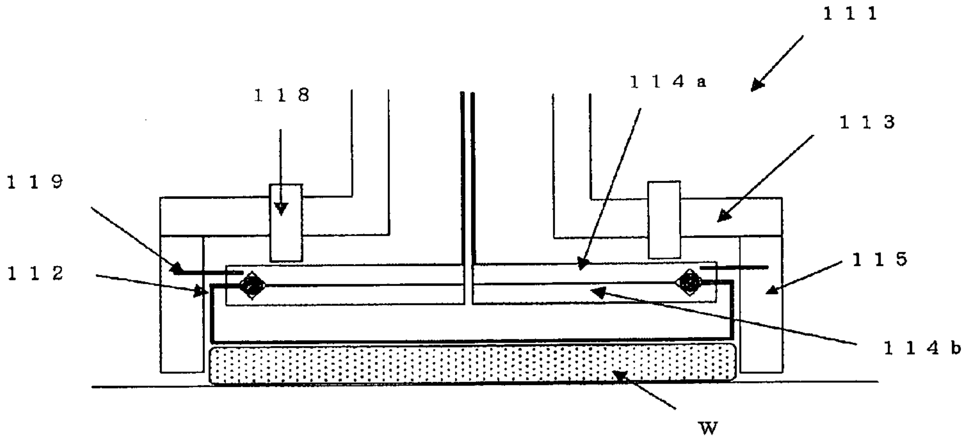
FIG. 8 is a schematic view showing another example of a conventional polishing head.
Figure 9:
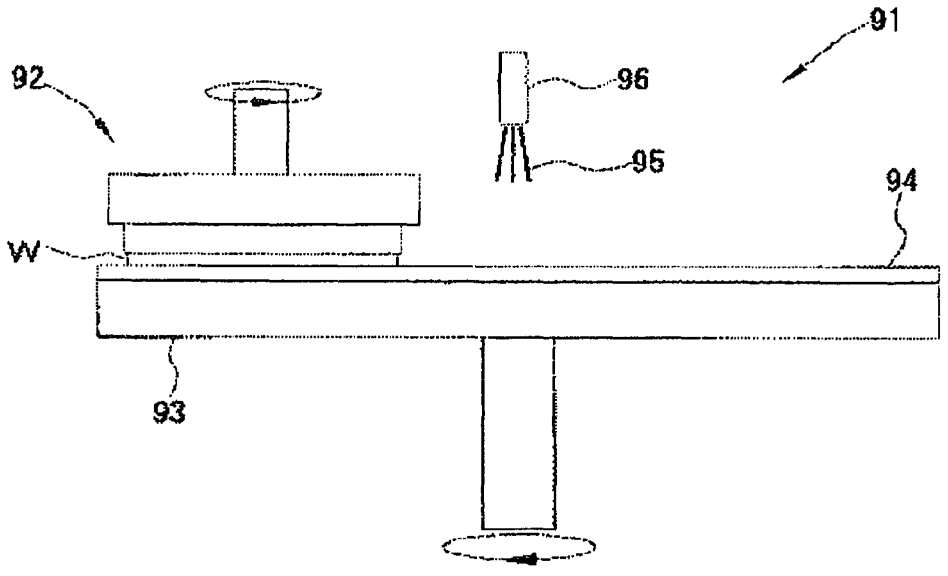
FIG. 9 is a schematic view showing an example of a conventional single-side polishing apparatus.

Rough polishing, final polishing, and cleaning processes were performed on silicon wafers in the same conditions as Example 1 except for using the conventional polishing apparatus including the conventional polishing head as shown in FIG. 8. The same evaluation as Example 1 was carried out.

The used polishing head 111 was configured as follows: mid plates 114*a* and 114*b* each having a thickness of 3 mm and an outer diameter of 293 mm were coupled to each other with a bolt; and a boot-shaped rubber film 112 made of silicone 70° having a thickness of 1 mm, a lower face portion diameter of 301 mm, a height of 6.5 mm, and an end portion that was formed into an O-ring shape (a diameter of 2 mm) and defined a diameter of 289 mm was interposed and held between the mid plates.

A circular backing pad was adhered to the lower face portion of the rubber film 112 with a double-stick tape. The inside of a ring-shaped elastic film 119 was attached to the mid plate and the outside of the elastic film was attached to the guide ring 115 on the polishing head body side. The guide ring 115 having an inner diameter of 302 mm was disposed around the rubber film and attached to the polishing head body 113.

The height of the polishing head body was adjusted such that the distance between the lower surface of the guide ring 115 and the surface of the polishing pad fell within 0.25 mm to 0.30 mm. The position of a stopper 118 was adjusted such that the height of the rubber film was adjusted so as to ensure uniform polishing stock removal.

Referring to Table 1 showing the results, the number of particles having a diameter of 45 nm or more in the polished wafer was 107. The polishing stock removal uniformity was 6.9%.

In Comparative Example, thus, the number of particles was a drastically deteriorated value of 107, whereas the polishing stock removal uniformity was approximate in comparison with Example 1.

TABLE 1

| | POLISHING STOCK REMOVAL UNIFORMITY (%) | NUMBER OF PARTICLES (NUMBER) |
|---|---|---|
| EXAMPLE 1 | 7.1 | 5 |
| EXAMPLE 2 | 6.3 | 2 |
| COMPARATIVE EXAMPLE | 6.9 | 107 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polishing head comprising: a disk-shaped mid plate provided below a polishing head body; a rubber film that covers at least a lower face portion and a side face portion of the mid plate, the rubber film being held by the mid plate; an annular guide ring for holding a side surface of a workpiece, the guide ring being disposed around the rubber film; a first sealed space portion surrounded by the mid plate and the rubber film; and a first pressure adjustment mechanism for adjusting pressure of the first sealed space portion by supplying fluid to an interior of the first sealed space portion, the polishing head being configured to hold a back surface of the workpiece on a lower face portion of the rubber film, press the workpiece with the first pressure adjustment mechanism, and bring a front surface of the workpiece into sliding contact with a polishing pad attached onto a turn table to polish the workpiece, the polishing head including a base member coupled to the polishing head body through an elastic film, the base member holding the guide ring and the mid plate such that a lower surface of the guide ring does not contact the polishing pad during polishing, wherein the base member is restricted from moving in an axial direction by contact between a part of an upper surface of the base member and the polishing head body and is capable of moving in a radial direction through the elastic film during polishing.

2. The polishing head according to claim 1, wherein a contact portion between the part of the upper surface of the base member and the polishing head body is configured such that the part of the upper surface of the base member contacts the polishing head body through a perfect sphere disposed in a concave portion provided at the polishing head body and/or the base member.

3. The polishing head according to claim 1, further including a second sealed space portion surrounded by the base member, the polishing head body and the elastic film and a second pressure adjustment mechanism for adjusting pressure of the second sealed space portion.

4. The polishing head according to claim 2, further including a second sealed space portion surrounded by the base member, the polishing head body and the elastic film and a second pressure adjustment mechanism for adjusting pressure of the second sealed space portion.

5. The polishing head according to claim 1, wherein a thrust bearing or a dry bearing is used in the contact portion between the part of the upper surface of the base member and the polishing head body.

6. The polishing head according to claim 2, wherein a thrust bearing or a dry bearing is used in the contact portion between the part of the upper surface of the base member and the polishing head body.

7. The polishing head according to claim 3, wherein a thrust bearing or a dry bearing is used in the contact portion between the part of the upper surface of the base member and the polishing head body.

8. The polishing head according to claim 4, wherein a thrust bearing or a dry bearing is used in the contact portion between the part of the upper surface of the base member and the polishing head body.

9. The polishing head according to claim 1, wherein an outer circumferential portion of the rubber film held by the mid plate is bifurcated such that the first sealed space portion is divided into two sealed spaces, and pressure of the divided two sealed spaces is adjustable independently of each other.

10. The polishing head according to claim 2, wherein an outer circumferential portion of the rubber film held by the mid plate is bifurcated such that the first sealed space portion is divided into two sealed spaces, and pressure of the divided two sealed spaces is adjustable independently of each other.

11. The polishing head according to claim 3, wherein an outer circumferential portion of the rubber film held by the mid plate is bifurcated such that the first sealed space portion is divided into two sealed spaces, and pressure of the divided two sealed spaces is adjustable independently of each other.

12. The polishing head according to claim 4, wherein an outer circumferential portion of the rubber film held by the mid plate is bifurcated such that the first sealed space portion is divided into two sealed spaces, and pressure of the divided two sealed spaces is adjustable independently of each other.

13. The polishing head according to claim 5, wherein an outer circumferential portion of the rubber film held by the mid plate is bifurcated such that the first sealed space portion is divided into two sealed spaces, and pressure of the divided two sealed spaces is adjustable independently of each other.

14. The polishing head according to claim 6, wherein an outer circumferential portion of the rubber film held by the mid plate is bifurcated such that the first sealed space portion is divided into two sealed spaces, and pressure of the divided two sealed spaces is adjustable independently of each other.

15. The polishing head according to claim 7, wherein an outer circumferential portion of the rubber film held by the mid plate is bifurcated such that the first sealed space portion is divided into two sealed spaces, and pressure of the divided two sealed spaces is adjustable independently of each other.

16. The polishing head according to claim 8, wherein an outer circumferential portion of the rubber film held by the mid plate is bifurcated such that the first sealed space portion is divided into two sealed spaces, and pressure of the divided two sealed spaces is adjustable independently of each other.

17. A polishing apparatus used for polishing a front surface of a workpiece including a polishing pad attached onto a turn table, a polishing agent supply mechanism for supplying a polishing agent onto the polishing pad, and the polishing head according to claim 1 as a polishing head for holding the workpiece.

18. A polishing apparatus used for polishing a front surface of a workpiece including a polishing pad attached onto a turn table, a polishing agent supply mechanism for supplying a polishing agent onto the polishing pad, and the polishing head according to claim 16 as a polishing head for holding the workpiece.

* * * * *